DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED JUNE 1, 1971

827 O.G. 5

T887,008

METHOD OF MAKING A SILVER HALIDE SENSITIZED DIRECT-POSITIVE LITHOGRAPHIC PRINTING PLATE

Edward C. Yackel, Pittsford, N.Y.
(Kodak Park Works, Rochester, N.Y. 14650)

Filed June 19, 1970, Ser. No. 47,892
Int. Cl. G03f *7/02*
U.S. Cl. 96—33
No Drawing. 7 Pages Specification

The method for preparing a photolithographic printing plate consists of the following steps: (a) a reducible salt such as a silver salt from which physical development nuclei will be prepared is added to a cellulose ester solution and this solution is then coated on a suitable support such as polyethylene terephthalate to form a hydrophobic layer and (b) the layer of (a) is treated with a hydrolyzing solution containing a reducing agent in which the hydrolyzing solution renders the hydrolyzed layer hydrophilic and the reducing agent also reduces the reducible salt to metallic nuclei and (c) the forming of a positive image in the above layer by coating, exposing and developing of a silver halide negative emulsion on the hydrolyzed layer with a processing solution containing a silver halide solvent to form an image by diffusion transfer and subsequent removal of the emulsion or by a diffusion transfer process in which the emulsion is coated on a separate sheet, exposed, developed and transferred to the hydrolyzed layer by steps (a) (b) above and treatment with an organic thiol to render the positive image hydrophobic and, therefore, ink receptive. If desired, the image may be rehalogenized before treating with the thiol.